(12) United States Patent
Yamashita et al.

(10) Patent No.: US 8,143,617 B2
(45) Date of Patent: Mar. 27, 2012

(54) SEMICONDUCTOR DEVICE, SEMICONDUCTOR DEVICE MANUFACTURING METHOD AND IMAGE DISPLAY DEVICE

(75) Inventors: Yoshihisa Yamashita, Kyoto (JP); Seiichi Nakatani, Osaka (JP)

(73) Assignee: Panasonic Corporation, Osaka (JP)

( * ) Notice: Subject to any disclaimer, the term of this patent is extended or adjusted under 35 U.S.C. 154(b) by 218 days.

(21) Appl. No.: 12/667,297

(22) PCT Filed: Jul. 1, 2008

(86) PCT No.: PCT/JP2008/001724
§ 371 (c)(1),
(2), (4) Date: Dec. 30, 2009

(87) PCT Pub. No.: WO2009/004793
PCT Pub. Date: Jan. 8, 2009

(65) Prior Publication Data
US 2010/0181558 A1    Jul. 22, 2010

(30) Foreign Application Priority Data
Jul. 3, 2007   (JP) .................................. 2007-174837

(51) Int. Cl.
*H01L 29/41* (2006.01)
*H01L 29/786* (2006.01)
*H01L 29/06* (2006.01)
*H01L 51/30* (2006.01)
*H01L 51/50* (2006.01)
*H01L 51/52* (2006.01)

(52) U.S. Cl. ........... 257/40; 257/E51.006; 257/E51.013; 257/E51.018; 257/E51.019; 438/99

(58) Field of Classification Search ........................ None
See application file for complete search history.

(56) References Cited

U.S. PATENT DOCUMENTS

| | | | | |
|---|---|---|---|---|
| 5,668,391 A * | 9/1997 | Kim et al. | ...................... | 257/328 |
| 6,667,551 B2 * | 12/2003 | Hanaoka et al. | .............. | 257/750 |
| 6,852,621 B2 * | 2/2005 | Hanaoka et al. | .............. | 438/638 |
| 6,913,944 B2 * | 7/2005 | Hirai | ................................ | 438/99 |
| 7,485,569 B2 * | 2/2009 | Ryu et al. | ...................... | 438/624 |
| 7,579,281 B2 * | 8/2009 | Koenenkamp et al. | ........ | 438/705 |

(Continued)

FOREIGN PATENT DOCUMENTS

CN            1839481            9/2006

(Continued)

OTHER PUBLICATIONS

Era, M. "Electroluminescent Device Using Two Dimensional Semiconductor (C6H5C2H4NH3)2PbI4 as an Emitter." Synthetic Metals 71.1-3 (1995): 2013-014.*

(Continued)

*Primary Examiner* — Benjamin Sandvik
*Assistant Examiner* — Joseph Schoenholtz
(74) *Attorney, Agent, or Firm* — Wenderoth, Lind & Ponack, L.L.P.

(57) ABSTRACT

A semiconductor device having semiconductor elements disposed with higher density and a method for manufacturing the same are provided. An image display device employing the semiconductor device is also provided. A semiconductor device comprises a resin film having a through hole; and a semiconductor element comprising a gate electrode disposed on the inner wall of the through hole, an insulating layer that covers the gate electrode within the through hole, an organic semiconductor disposed on the insulating layer within the through hole, and a source electrode and a drain electrode which are electrically connected to the organic semiconductor.

22 Claims, 10 Drawing Sheets

U.S. PATENT DOCUMENTS

| | | | |
|---|---|---|---|
| 2004/0201107 A1 | 10/2004 | Koenenkamp | |
| 2006/0162474 A1* | 7/2006 | Kasama et al. | 73/866.1 |
| 2006/0226497 A1 | 10/2006 | Chen et al. | |
| 2006/0284180 A1* | 12/2006 | Kondoh | 257/59 |
| 2009/0189148 A1* | 7/2009 | Araumi et al. | 257/40 |

FOREIGN PATENT DOCUMENTS

| | | |
|---|---|---|
| JP | 2003-086804 | 3/2003 |
| JP | 2005-503042 | 1/2005 |
| JP | 2007-067263 | 3/2007 |

OTHER PUBLICATIONS

International Search Report issued Aug. 5, 2008 in International (PCT) Application No. PCT/JP2008/001724.

International Preliminary Report on Patentability issued Jan. 26, 2010 in PCT/JP2008/001724, including Forms PCT/IB/338, PCT/IB/373 and PCT/ISA/237 (in English).

Chinese Office Action issued Nov. 9, 2010 in corresponding Chinese Application No. 200880021974 (with English translation).

* cited by examiner

Fig.7
(a)
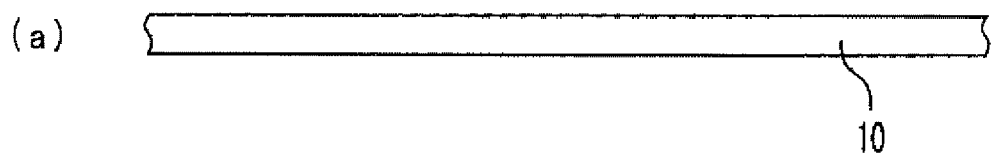
(b)
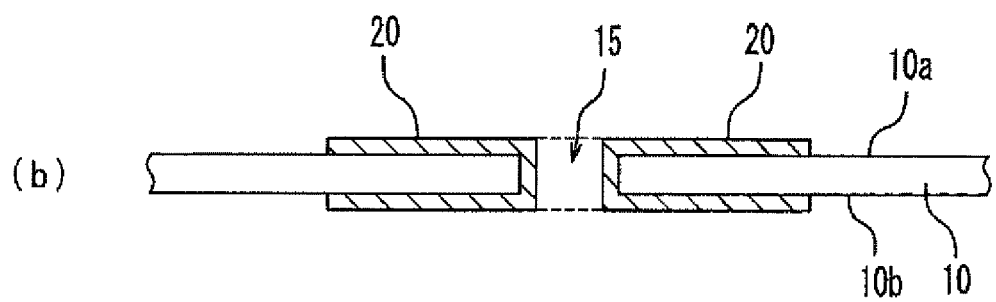
(c)
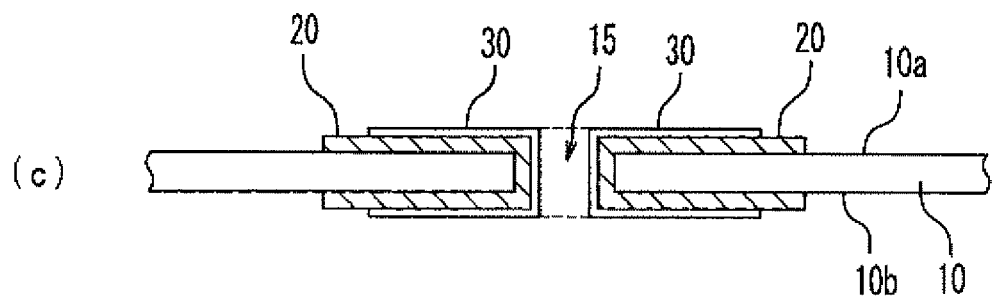

Fig.8
(a) 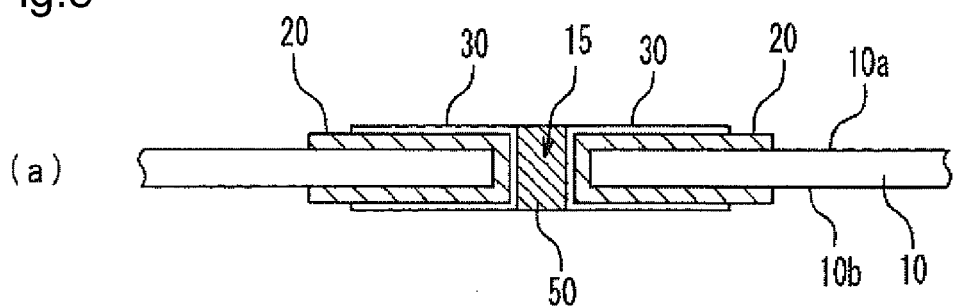
(b) 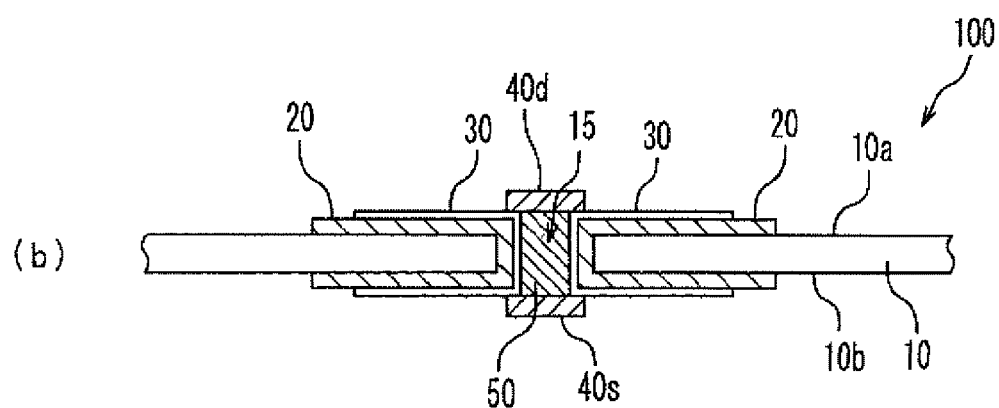

Fig.9
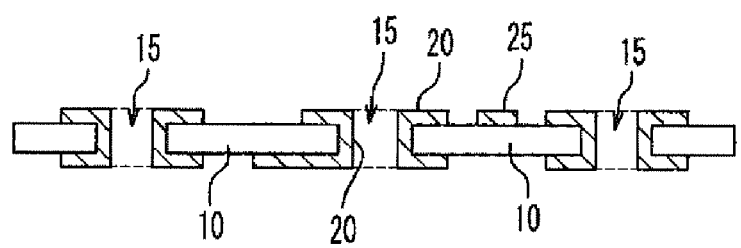
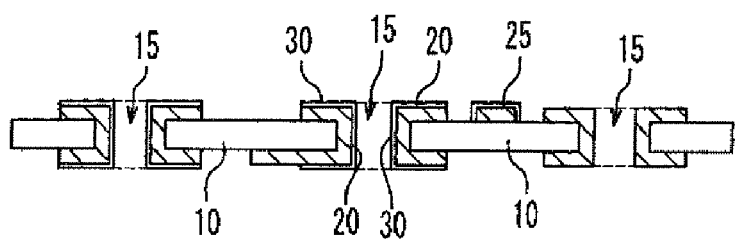
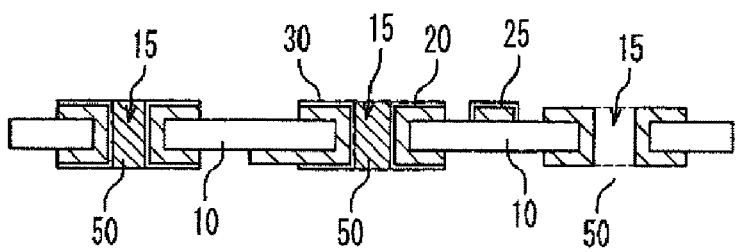
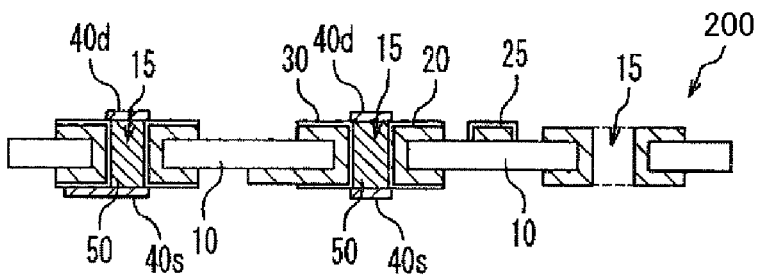

SEMICONDUCTOR DEVICE, SEMICONDUCTOR DEVICE MANUFACTURING METHOD AND IMAGE DISPLAY DEVICE

BACKGROUND OF THE INVENTION

1. Field of the Invention

The present invention relates to a semiconductor device that has an organic semiconductor, a method for manufacturing the same, and an image display device equipped with the semiconductor device, and particularly to a semiconductor device that has an organic semiconductor formed on a resin film, a method for manufacturing the same, and an image display device equipped with the semiconductor device.

2. Description of the Related Art

As the number of information terminals in use increases, needs have been growing for flat panel displays of lighter weight for use in computers. The proliferation of information technologies has also increased the opportunities of handling information, which has previously been conveyed by paper media, in the form of electronic information. This trend has increased the needs for electronic paper or digital paper for mobile display medium that is thin and light weight and can be easily carried (JP 2007-67263A, etc.).

In a flat panel display device in general, a display medium is formed by using elements based on liquid crystal, organic EL (electro-luminescence), electrophoresis or the like. Such a display medium chiefly employs active drive elements (TFT elements) as the picture drive elements, in order to ensure the uniformity of screen brightness, screen refreshing rate and other performance. In a common computer display, for example, the TFT elements are formed on a glass substrate, and liquid crystal or organic EL elements are sealed therein.

As the TFT element, Si semiconductor such as a-Si (amorphous silicon), p-Si (polycrystalline silicon) or the like is mainly used. The Si semiconductor (together with a metal layer as required) is formed in a plurality of layers so as to form source, drain and gate electrodes successively on the substrate, thereby constituting the TFT element.

Formation of the TFT element from the Si semiconductor involves the following two problems.

First, it is necessary to form the layers by repeating the sputtering and other manufacturing processes in a vacuum system that requires a vacuum chamber, thus making the equipment cost and the running cost very expensive. For example, forming each layer requires it to repetitively carry out vacuum vapor deposition, doping, photolithography, development of latent image and other processes, and the element is formed on the substrate through several dozens of processes. The semiconductor that is the critical part of switching operation is also formed by stacking semiconductor layers of a plurality of kinds such as p type and n type. With such a conventional manufacturing method that uses the Si semiconductor, it is difficult to change the production facilities so as to manufacture larger display screens, because it requires significant design change of the production facilities such as the vacuum chamber.

Second, materials to be used are limited to heat resistant ones, and materials such as a resin film that is light in weight and has pliability cannot be used as the substrate.

The process of forming the TFT element from Si includes heating to a temperature as high as 500 to 1,000° C. Therefore, the substrate must be formed from a material that endures such a high temperature, which is practically limited to glass. As a result, when a thin display such as electronic paper or digital paper is made by using TFT elements based on Si semiconductor, use of the glass substrate makes the display heavy and hard without flexibility, thus easily broken when dropped. Therefore, it is difficult to meet the need for a portable and slim display with an image display device constituted by forming TFT elements on a glass substrate.

A semiconductor material that has been vigorously researched in recent years as a promising candidate for solving the problems described above is the organic semiconductor material. The organic semiconductor material is an organic compound that has high charge mobility, and is applicable to an organic laser oscillating element and an organic thin film transistor (organic TFT) as well as the charge transporting material of an organic EL element.

A semiconductor device (organic semiconductor device) based on an organic semiconductor can be made in a process of a relatively low temperature, and therefore imposes a more tolerant requirement of heat resistance on the substrate, so that the TFT elements can be formed on a flexible material such as a transparent resin substrate. An organic semiconductor in the form of solution can also be made by properly modifying the molecular structure. When the organic semiconductor solution is used as an ink in a printing process based on an ink jet method, it is made possible to manufacture the semiconductor device under a condition that does not require a vacuum such as in an inactive gas atmosphere.

Electronics technology based on a printing process makes it possible to carry out the process at a low temperature (get rid of high temperature), mitigation of vacuum process (in addition to the advantage of getting rid of vacuum) and carry out the process without photolithography (get rid of photolithography).

FIG. 15 is a sectional view schematically showing the structure of a semiconductor device (flexible semiconductor device) 1000 that includes an organic semiconductor 130 manufactured by using the printing process. The semiconductor device 1000 a structure including layers (120, 130, 140, 150) formed by printing on a resin substrate (such as PET or PI) 110. In the structure illustrated, a wiring layer 120, an organic semiconductor layer 130, an insulating film 140 and a wiring layer 150 are formed successively on the resin substrate 110. While the specific structure may be altered as required, a source electrode 120s, a drain electrode 120d and a gate electrode 150g are disposed around the organic semiconductor layer 130, thereby forming the organic TFT.

The display that is lighter in weight than the conventional displays and has pliability so as not to break (or is very unlikely to break) when dropped can be made as described above, by forming the TFT elements that drive the display material on the transparent resin substrate.

There are demands for thin displays such as electronic paper or digital paper that are even more compact and lighter in weight. To meet the demands, it is necessary to form the semiconductor elements with higher density in the semiconductor device 1000.

Similarly, there are also strong demands for stationary display devices based on liquid crystal or organic EL that are larger in screen size but smaller in weight and thinner in thickness, and for higher display quality (higher resolution) to be achieved by forming more pixels in a given area. It is necessary to form the semiconductor elements with higher density in the semiconductor device 1000 also for the purpose of meeting these demands.

However, since the semiconductor device 1000 has a structure of flat layers (120, 130, 140, 150) formed one on another on the resin substrate 110, there is a limitation to the improvement of density of semiconductor elements that can be formed.

SUMMARY OF THE INVENTION

It is an object of the present invention to provide a semiconductor device having semiconductor elements disposed with higher density by forming the semiconductor elements within a resin film substrate, and a method for manufacturing the same. It is also an object of the present invention to provide an image display device that employs the semiconductor device having the semiconductor elements formed within the resin film substrate.

A first aspect of the present invention is a semiconductor device comprising: a resin film having a through hole; and a semiconductor element comprising a gate electrode disposed on the inner wall of the through hole, an insulating layer that covers the gate electrode within the through hole, an organic semiconductor disposed on the insulating layer within the through hole, and a source electrode and a drain electrode which are electrically connected to the organic semiconductor.

A second aspect of the present invention is the semiconductor device according to the first aspect, wherein the source electrode makes contact with the entire surface of one end of the organic semiconductor.

A third aspect of the present invention is the semiconductor device according to the first or second aspect, wherein the drain electrode makes contact with the entire surface of the other end of the organic semiconductor.

A fourth aspect of the present invention is the semiconductor device according to any one of the first to third aspects, wherein the organic semiconductor is sealed by the source electrode, the drain electrode and the insulating layer.

A fifth aspect of the present invention is the semiconductor device according to any one of the first to fourth aspects, wherein the organic substance semiconductor is hollow in the inside thereof.

A sixth aspect of the present invention is the semiconductor device according to the fifth aspect, wherein the hollow space of the organic semiconductor is filled with an insulating material.

A seventh aspect of the present invention is the semiconductor device according to any one of the first to sixth aspects, wherein at least one of the source electrode and the drain electrode makes contact with the compound semiconductor within the through hole.

An eighth aspect of the present invention is the semiconductor device according to the first to seventh aspects, wherein the resin film has a second via formed from a second through hole and an electrically conductive composition in the second through hole, while a wiring disposed on one surface of the resin film and a wiring disposed on the other surface of the resin film are electrically connected with each other by the second via.

A ninth aspect of the present invention is the semiconductor device according to any one of the first to eighth aspects, that has a second resin film of which one surface makes contact with the surface of the resin film on the source electrode side thereof via a first adhesive layer, and a third via formed from a third through hole formed in the second resin film and an electrically conductive composition in the third through hole, while the source electrode is electrically connected with a wiring that is disposed on the other surface of the second resin film via the third via.

A tenth aspect of the present invention is the semiconductor device according to the ninth aspect, wherein the source electrode is embedded in the first adhesive layer.

An eleventh aspect of the present invention is the semiconductor device according to any one of the first to tenth aspects, that has a third resin film of which one surface makes contact with the surface of the resin film on the drain electrode side thereof via the second adhesive layer, and a fourth via formed from a fourth through hole formed in the third resin film and an electrically conductive composition in the fourth through hole, while the drain electrode is electrically connected with a wiring disposed on the other surface of the third resin film via the fourth via.

A twelfth aspect of the present invention is the semiconductor device according to the eleventh aspect, wherein the drain electrode is embedded in the second adhesive layer.

A thirteenth aspect of the present invention is the semiconductor device according to any one of the first to twelfth aspects, wherein the organic semiconductor is formed from a polymeric organic semiconductor material.

A fourteenth aspect of the present invention is the semiconductor device according to any one of the first to thirteenth aspects, wherein the organic semiconductor is formed from a low molecular organic semiconductor material.

A fifteenth aspect of the present invention is the semiconductor device according to any one of the first to fourteenth aspects, wherein the resin film is formed from one material selected from among the group consisting of a polyimide resin, a polyamide resin, a polyethylene naphthalate resin and an aramid resin.

A sixteenth aspect of the present invention is the semiconductor device according to any one of the first to fifteenth aspects, wherein the source electrode and the drain electrode are formed from noble metal.

A seventeenth aspect of the present invention is an image display device comprising a display section having an array of light emitting elements and a drive circuit layer that drives the light emitting elements used in the display section, wherein the drive circuit layer includes the semiconductor device according to any one of the first to sixteenth aspects.

An eighteenth aspect of the present invention is the display device according to the seventeenth aspect, wherein the semiconductor element of one of the first to sixteenth aspects is used as an ON/OFF switching transistor.

A nineteenth aspect of the present invention is the display device according to the seventeenth or eighteenth aspect, wherein the semiconductor element of one of the first to sixteenth aspects is used as driver transistor that drives light emission by the light emitting element.

A twentieth aspect of the present invention is the display device according to any one of the seventeenth to nineteenth aspects, wherein the light emitting element is an organic electroluminescence element.

A twenty-first aspect of the present invention is a method for manufacturing a semiconductor device, comprising steps of forming a through hole in a first resin film, disposing a gate electrode on the inner wall of the through hole, forming an insulating layer that covers the gate electrode within the through hole, forming an organic semiconductor disposed on the insulating layer within the through hole, and forming a source electrode and a drain electrode that are electrically connected to the organic semiconductor.

A twenty-second aspect of the present invention is a method for manufacturing a semiconductor device according to the twenty-first aspect, comprising steps of embedding the source electrode in a second resin film, and electrically connecting the source electrode and the organic semiconductor by disposing the second resin film having the source electrode embedded therein on the first resin film.

A twenty-third aspect of the present invention is a method for manufacturing a semiconductor device according to the twenty-first or twenty-second aspect, comprising steps of embedding the drain electrode in a third resin film, and electrically connecting the drain electrode and the organic semiconductor by disposing the third resin film having the drain electrode embedded therein on the first resin film.

It is made possible to provide a semiconductor device of high-density integration and a method for manufacturing the same, by using the semiconductor device that has the gate electrode, the insulating layer and the semiconductor element including the organic semiconductor disposed within the through hole provided in the resin film. Use of the semiconductor device also makes it possible to provide an image display device that is smaller in size such as thickness and lighter in weight.

BRIEF DESCRIPTION OF THE DRAWINGS

FIG. 7 is a sectional view showing a method for manufacturing the semiconductor device 100 according to the first embodiment of the present invention.

FIG. 8 is a sectional view showing the method for manufacturing the semiconductor device 100 according to the first embodiment of the present invention.

FIG. 9 is a sectional view showing a method for manufacturing a semiconductor device 200 according to a second embodiment of the present invention.

DETAILED DESCRIPTION OF THE INVENTION

Figure 1:
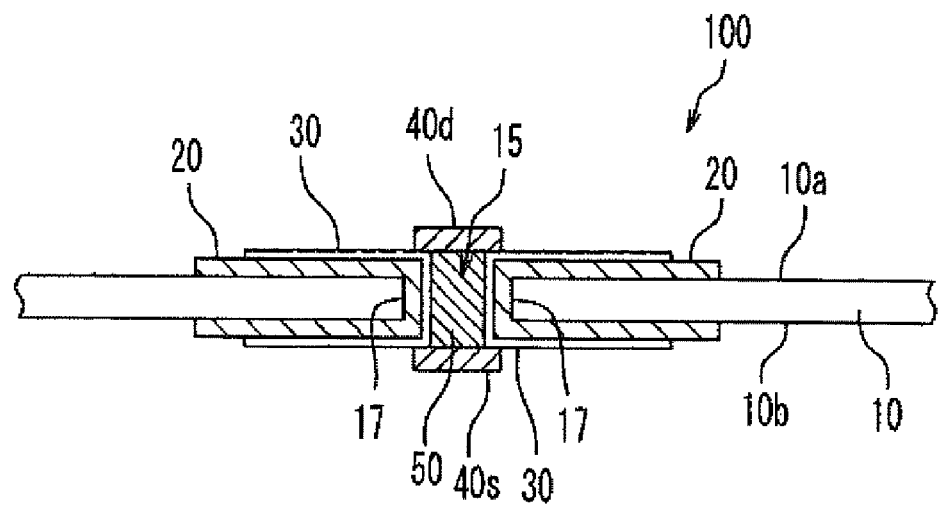
FIG. 1 is a sectional view schematically showing the constitution of a semiconductor device 10Q according to a first embodiment of the present invention.

Embodiments of the present invention will be described in detail with reference to the accompanying drawings. In the description that follows, terms that indicate particular directions or positions (such as upper, lower, right, left and other similar phrases) will be used as required, which is for the purpose of making it easier to understand the present invention with reference to the accompanying drawings. These terms are not intended to restrict the scope of the present invention. Identical reference numeral used in different drawings means the identical part or member.

First Embodiment

FIG. 1 is a partial sectional view schematically showing the constitution of a semiconductor device 100 according to the first embodiment of the present invention. The semiconductor device of the first embodiment has an organic semiconductor section 50 provided in a through hole 15. Specifically, the semiconductor device 100 has a resin film (flexible substrate) 10 that has the through hole 15 formed therein, a metal layer 20 formed on the wall surface (inner wall) 17 of the through hole 15, an insulating layer 30 formed to cover the metal layer 20 within the through hole 15 and the organic semiconductor section 50 formed on the insulating layer 30. Electrically connected to the organic semiconductor section 50 are a source electrode 40s and a drain electrode 40d.

With this constitution, a semiconductor element (MOSFET) is formed from the organic semiconductor section 50, the insulating layer 30, the metal layer 20, the source electrode 40s and the drain electrode 40d. In the semiconductor element, the insulating layer 30 serves as a gate insulating film, and the metal layer 20 serves as a gate electrode. In the embodiment shown in FIG. 1, the metal layer 20 is formed to extend also on the surface of the resin film 10 (an upper surface 10a and a lower surface 10b of the resin film 10 in FIG. 1), and the extended metal layer 20 is used as a wiring. The wiring may be formed either on one or both of the upper surface 10a and the lower surface 10b of the resin film 10.

The insulating layer 30 may cover a part of the metal layer 20 that extends on the upper surface 10a or the lower surface 10b of the resin film 10, as shown in FIG. 1.

Figure 2:
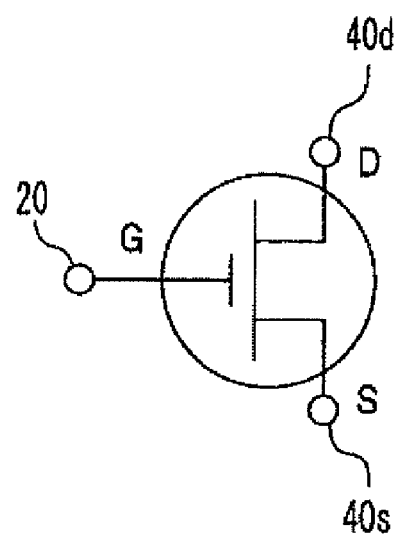
FIG. 2 is a diagram depicting circuit elements corresponding to the semiconductor device 100 according to the first embodiment of the present invention.

The drain electrode 40d and the source electrode 40s are formed to make contact with one end (the upper end in the embodiment shown in FIG. 1) and the other end (the lower end in the embodiment shown in FIG. 1) of the organic semiconductor section 50, respectively. The drain electrode 40d and the source electrode 40s, which are formed from a metal such as noble metal, for example, make ohmic contact (electrically connected) with the organic semiconductor section 50, thereby constituting a TFT element that is shown in FIG. 2, in the semiconductor device 100.

Thus the semiconductor elements such as TFT are formed in the through hole of the substrate (resin film) 10 on which semiconductor element (organic semiconductor element) has never been formed in the conventional art. As a result, since space for the semiconductor device 100 can be efficiently utilized three-dimensionally, the semiconductor elements can be formed with a higher density.

The operating principle of the semiconductor device 100 will be described.

When a voltage is applied to the gate electrode 20, carriers of the electric charge that is repelled by the polarity of the applied voltage within the organic semiconductor section 50 are repelled from the vicinity of the gate electrode (a depleted layer is created). When a voltage higher than a certain level is applied, carriers of the electric charge that is attracted by the polarity of the voltage applied to the gate electrode are induced into the interface between the insulating layer 30 and the organic semiconductor section 50, and are accumulated therein. When a voltage is applied between the drain electrode 40d and the source electrode 40s under this condition, the carriers accumulated in the interface are driven by the electric field generated between the source electrode and the drain electrode so as to be absorbed by the drain, thereby generating a current flowing between the source electrode and the drain electrode.

When the amount of the carriers accumulated in the interface is modulated by controlling the voltage that is applied to the gate electrode 20, the current flowing between the drain electrode 40*d* and the source electrode 40*s* can be varied so as to enable, for example, switching operation.

The components of the semiconductor device 100 will be described in detail.

The resin film 10 is formed, for example, from a polyimide resin (PI), a polyamide resin (PA), a polyethylene naphthalate resin (PEN) or an aramid resin. These resin materials have excellent properties of heat resistance, dimensional stability and preventing gas permeation, and are preferably used as the material to form the flexible substrate (resin film) 10 of the semiconductor device 100. The resin film 10 has a thickness of, for example, from 1 to 25 µm.

The through hole 15 formed in the resin film 10 has a round cross section (section parallel to the surface of the resin film 10) formed by, for example, laser machining. The diameter of the through hole 15 is, for example, from 1 to 25 µm.

The metal layer 20 formed on the wall surface 17 of the through hole 15 is, for example, copper plating and has a thickness from 0.1 to 18 µm. The metal layer 20 preferably covers the wall surface 17 of the through hole 15 as a whole, but may instead cover only a part of the wall surface 17 of the through hole 15. Also as described previously, the metal layer 20 may be formed so as to cover a part of the upper surface 10*a* of the resin film 10 and/or a part of the lower surface 10*b* of the resin film 10.

The insulating layer 30 that covers the metal layer 20 is formed from PVA (polyvinyl alcohol), PVP (poly-4-vinyl phenol), BCB (benzocyclobutene) or $SiO_2$ formed by applying polysilazane. The insulating layer 30 has such a thickness that it can function as the gate insulating layer, for example, from 50 to 300 nm.

The organic semiconductor section 50 fills the inside of the through hole 15, and is formed so as to make contact with the insulating layer 30. In order to allow for an increase in the contact area between the insulating layer 30 and the organic semiconductor section 50, it is preferable that the organic semiconductor section 50 covers the entire surface of the part of the insulating layer 30 located inside of the through hole 15 (the surface not in contact with the metal layer 20), although the organic semiconductor section 50 may also cover only partially.

Various materials may be used for the organic semiconductor material that constitutes the organic semiconductor section 50. An organic semiconductor material that has high charge mobility is preferably used, such as pentacene. Organic semiconductor materials are roughly classified into polymeric materials (such as polythiophene or derivatives thereof), low molecular materials (such as pentacene or solubilized pentacene), nano-carbon materials (such as carbon nanotube, SiGe nanowire, fullerene, modified fullerene), inorganic-organic mixed material (such as a composite material constituted from $C_6H_5C_7H_4NH_3$ and $SnI_4$) and so on, all of which can be used as the organic semiconductor section 50. Other examples of the organic semiconductor material will be further described later.

As shown in FIG. 1, the drain electrode 40*d* that makes ohmic contact with one end (upper end in FIG. 1) of the organic semiconductor section 50 is disposed so as to be separated from the gate electrode 20. The source electrode 40*s* that makes ohmic contact with the other end (lower end in FIG. 1) of the organic semiconductor section 50 is disposed so as to be separated from the gate electrode 20.

It is preferable to cover the organic semiconductor section 50 with the source electrode 40*s*, the gate electrode 40*d* and the insulating layer 30 that cover the organic semiconductor section 50 by, for example, putting the source electrode 40*s* and the gate electrode 40*d* into contact with the insulating layer 30 (or closely contacting the source electrode 40*s* and the gate electrode 40*d* with the insulating layer 30) at corners of the insulating layer 30 (the corners formed by the intersecting portion between a part of the insulating layer 30 that extends in parallel to the top surface a of the substrate 20 and a part of the insulating layer 30 that extends in parallel to the wall surface 17 of the through hole 15), to thereby seal the organic semiconductor section 50.

This preferred embodiment makes it possible to solve the following problems encountered in the semiconductor device 1000 of the conventional art.

The organic semiconductor has lower charge mobility than that of inorganic semiconductor materials (such as polysilicon), while the charge mobility decreases further in an atmosphere of air or oxygen. As a result, there arises such a problem that the organic semiconductor layer 140 may be deteriorated by oxygen after forming the organic semiconductor layer 140 by printing.

In the semiconductor device 100, the organic semiconductor section 50 disposed in the through hole 15 can be kept from making contact with oxygen (or air) by sealing the organic semiconductor section 50, thus making it possible to suppress or mitigate the degradation with age of the organic semiconductor that constitutes the organic semiconductor section 50.

It is one of great advantages of the semiconductor device 100 of the present invention that the organic semiconductor section 50 can be easily suppressed from making contact with oxygen simply by putting the source electrode 40*s* and the drain electrode 40*d* into contact with the insulating layer 30.

In case the insulating layer 30 covers only a part of the wall surface 17 of the through hole 15 via the metal layer 20 due to a configuration in which the metal layer 20 is disposed only in a part of the wall surface 17 of the through hole 15, the organic semiconductor section 50 may be sealed by means of the source electrode 40*s*, the gate electrode 40*d*, the insulating layer 30 and the wall surface 17 of the through hole 15.

As shown in FIG. 1, one end (upper end in FIG. 1) of the organic semiconductor section 50 preferably makes ohmic contact, through the entire surface thereof, with the drain electrode 40*d*. Similarly, the other end (lower end in FIG. 1) of the organic semiconductor section 50 preferably makes ohmic contact, through the entire surface thereof, with the source electrode 40*s*. This is for the purpose of increasing the contact area between the source electrode 40*s* and the organic semiconductor section 50 and the contact area between the drain electrode 40*d* and the organic semiconductor section 50, thereby decreasing the electrical resistance.

The source electrode 40*s* and the drain electrode 40*d* are formed from a metal foil of a noble metal such as gold (Au) that is capable of making ohmic contact with the organic semiconductor section 50, and have a thickness of, for example, from 0.02 to 3 µm.

In the semiconductor device 100, as described above, the gate electrode 20, the source electrode 40*s* and the drain electrode 40*d* can all be formed from a metal foil such as plating.

This means that it is made possible to solve the problems described below that arise when the wiring layers 120, 150 that include the gate electrode, the source electrode and the drain electrode are formed by a printing process such as ink jet printing in the semiconductor device 1000 of the conventional art.

The semiconductor device 1000 of the conventional art has such problems that a sintering temperature as high as 600 to 1,000° C. that inhibits the use of resin film substrate is required, for forming the wiring layers from ordinary metal particles, and that ink jet nozzles may be clogged. Accordingly, the wiring is formed from a mixture of an ink solution and metal particles that have been made extremely small on the order of a nanometer (nano-paste material).

However, the nano-paste material is very expensive. In addition, the wiring that is formed from the nano-paste material is formed by sintering metal particles on the order of a nanometer, and therefore has a problem of high electrical resistance due to oxide film on the surface of the metal particles.

The semiconductor device 100 of this embodiment does not require the use of nano-paste material, and therefore makes it possible to form wiring that includes the gate electrode, the source electrode and the drain electrode at a lower cost than in the case of the semiconductor device 1000 of the conventional art, and significantly decreases the electrical resistance.

Variations of the semiconductor device 100 will be described.

Figure 3:
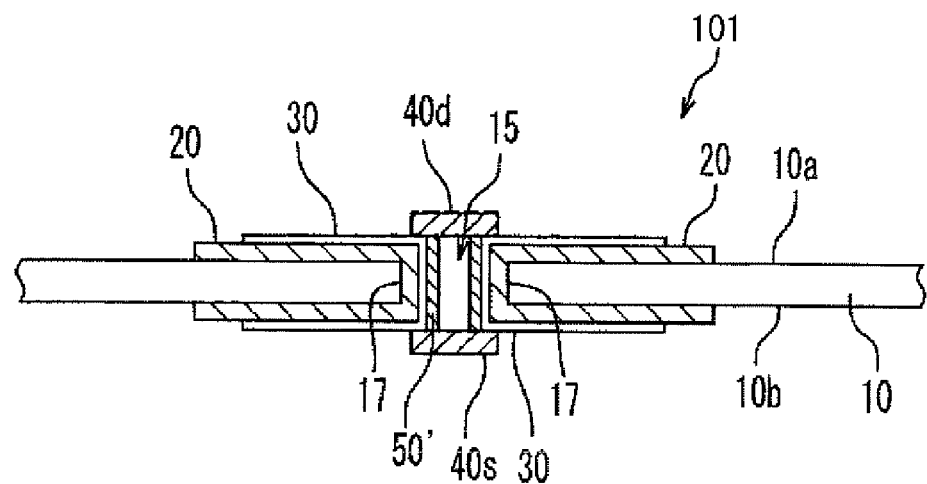
FIG. 3 is a sectional view schematically showing the constitution of a semiconductor device 101 according to the first embodiment of the present invention.

FIG. 3 is a sectional view showing a semiconductor device 101 that is a first variation of the semiconductor device 100. An organic semiconductor section 50' of the semiconductor device 101 is hollow in the inside thereof. Such a hollow structure can be formed by coating the inside of the through hole 15 with a solvent including organic semiconductor material dispersed therein, then removing (vaporizing) the solvent so as to leave the organic semiconductor material remaining on the wall surface of the through hole 15 (surface of the insulating layer 30). The hollow structure can be formed also by vapor deposition of the organic semiconductor material on the wall surface of the through hole 15 (surface of the insulating layer 30).

The semiconductor device 101 that has the hollow organic semiconductor section 50' has advantages that the amount of organic semiconductor material used can be reduced, and that the hollow space can be filled with other material as required.

Figure 4:
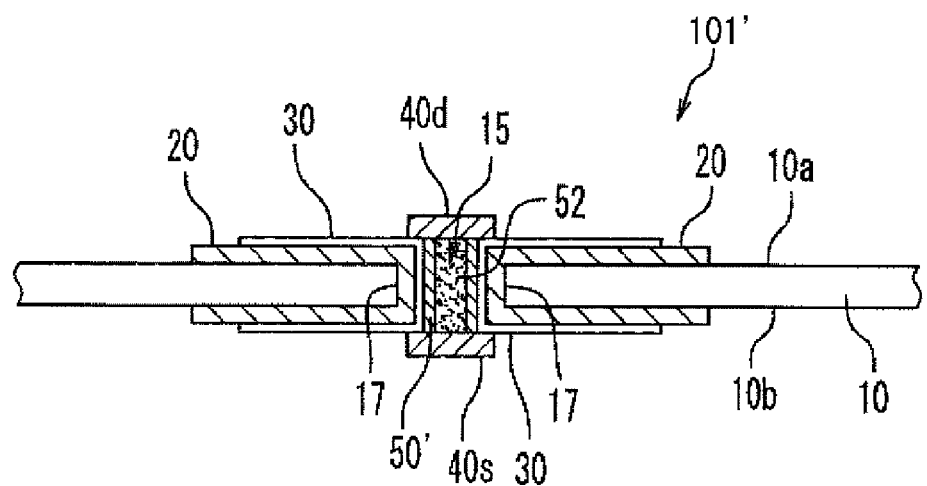
FIG. 4 is a sectional view schematically showing the constitution of a semiconductor device 101' according to the first embodiment of the present invention.

FIG. 4 is a sectional view showing the constitution of a semiconductor device 101' that is a variation of the semiconductor device 101. The semiconductor device 101' employs the organic semiconductor section 50' that is hollow in the inside thereof, similarly to the case of the semiconductor device 101, but is different from the semiconductor device 101 in that this space is filled with a solid material.

Specifically, the organic semiconductor section 50' of the semiconductor device 101' is filled with another material such as an insulating material 52, as shown in FIG. 4. When the inside of the organic semiconductor section 50' is filled with the insulating material 52, for example, it has a remarkable effect of enhancing the leakage preventing effect between the source electrode 40s and the drain electrode 40d.

Figure 5:
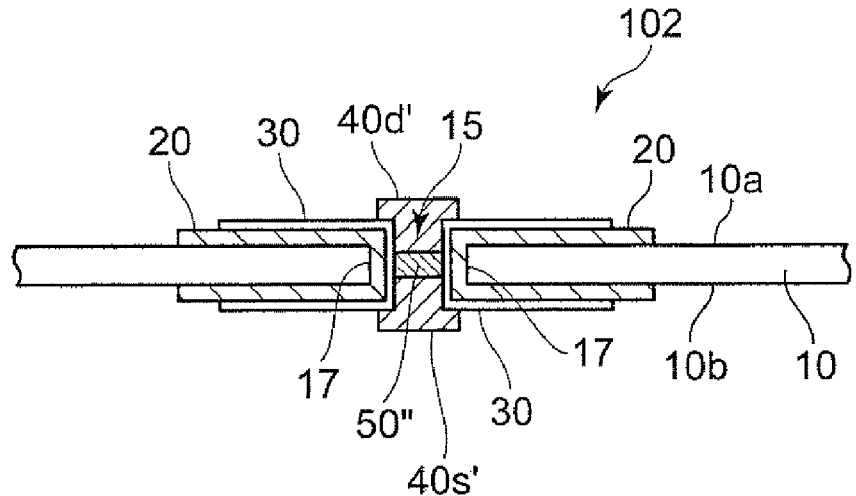
FIG. 5 is a sectional view schematically showing the constitution of a semiconductor device 102 according to the first embodiment of the present invention.

FIG. 5 is a sectional view showing a semiconductor device 102 that is another variation of the semiconductor device 100.

The length of an organic semiconductor section 50" of the semiconductor device 102 (length of the through hole 15 in the penetrating direction) is smaller than the length of the through hole 15 (length in the penetrating direction). In other words, only a part of the through hole 15 in the longitudinal direction is filled with the organic semiconductor section 50". In the meantime, the source electrode 40s' and the drain electrode 40d' extend to the inside of the through hole 15 as shown in FIG. 5. As a result, the source electrode 40s' and the drain electrode 40d' make ohmic contact with the organic semiconductor section 50" within the through hole 15.

The semiconductor device 102 has such an advantage that the distance between the source electrode 40s' and the drain electrode 40d' can be decreased without changing the length of the through hole 15.

A semiconductor device of such a constitution is also included in the scope of the semiconductor device 102, that one end face of the organic semiconductor section 50" and the surface of a part of the insulating layer 30 that extends parallel to the upper surface 10a of the resin film 10 (either one of the extended portions which the insulating layer 30 shown in FIG. 5 has on the side of the upper surface 10a and the side of the lower surface 10b) lie in the same plane, with only the other end face of the organic semiconductor section 50" being disposed in the inside of the through hole 15, that is, only one of the source electrode 40s' and the drain electrode 40d' makes contact with the organic semiconductor section 50" in the through hole 15.

Figure 6:
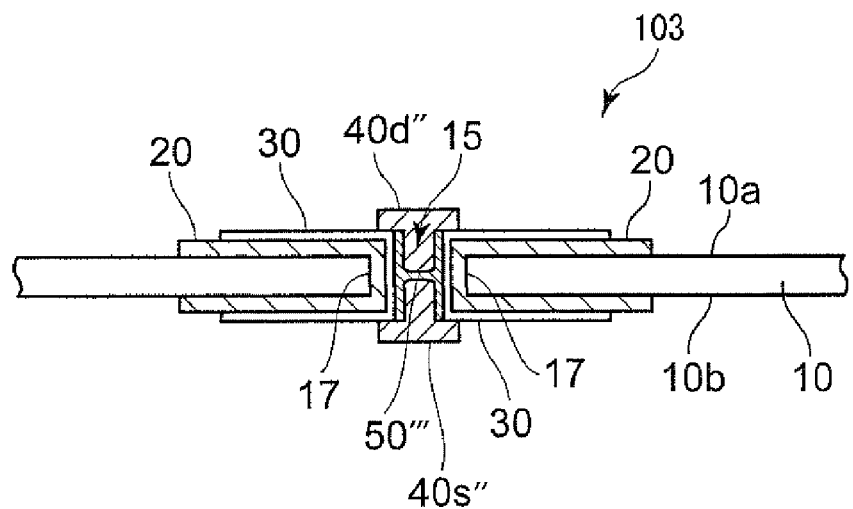
FIG. 6 is a sectional view schematically showing the constitution of a semiconductor device 103 according to the first embodiment of the present invention.

FIG. 6 is a sectional view showing a semiconductor device 103 that is another variation of the semiconductor device 100. An organic semiconductor section 50''' of the semiconductor device 103 has recesses on both ends thereof. A source electrode 40s" extends into the recess provided at one end of the organic semiconductor section 50''', while the source electrode 40s" makes ohmic contact with the organic semiconductor section 50''' in the recess provided at this end. Similarly, a drain electrode 40d" extends into the recess provided at the other end of the organic semiconductor section 50''', while the drain electrode 40d" makes ohmic contact with the organic semiconductor section 50''' in the recess provided at this other end.

As a result, the source electrode 40s" and the drain electrode 40d" make ohmic contact with the organic semiconductor section 50''' within the through hole 15.

The semiconductor device 103 has an advantage that the contact area between the source electrode 40s" and the organic semiconductor section 50''' and the contact area between the drain electrode 40d" and the organic semiconductor section 50''' can be increased without increasing the radius of the through hole 15, in addition to the same advantage of the semiconductor device 102 that the distance between the source electrode 40s' and the drain electrode 40d' can be decreased without changing the length of the through hole 15.

A semiconductor device of such a constitution is also included in the scope of the semiconductor device 103, that the organic semiconductor section 50''' has a recess only on one of the ends, and therefore only one of the source electrode 40s" and the drain electrode 40d" makes contact with the organic semiconductor section 50''' in the through hole 15.

The organic semiconductor material used to form the organic semiconductor sections 50', 50" and 50''' in the variations of the first embodiment are the same as that of the organic semiconductor section 50. Similarly, the material used to form the source electrodes 40s', 40s" and the drain electrodes 40d', 40d" is the same material as that used to form the source electrode 40s and the drain electrode 40d.

The method for manufacturing the semiconductor device 100 of the first embodiment will be described with reference to FIG. 7(a) to FIG. 8(b).

First, the resin film 10 is prepared as shown in FIG. 7(a). The resin film 10 may be, for example, an aramid resin film having a thickness of 4 μm. Other resins may also be used such as a polyimide resin, a polyamide resin, and a polyethylene naphthalate resin.

Then after forming the through hole 15 in the resin film 10 as shown in FIG. 7(b), wall surface of the through hole 15 is plated with a metal. The upper surface 10a and/or the lower surface 10b of the resin film 10 is also plated with a metal as required. Then a patterning is conducted on the metal plating to form the metal layer 20.

The through hole 15 is formed by, for example, irradiating with a laser beam. The through hole 15 may also be formed by other methods such as etching. The through hole 15 has a round shape when viewed from above the resin film 10 in the embodiment shown in FIG. 7, but may also have other shapes such as oval, elongated circle or rectangle.

The metal layer 20 is formed from, for example, copper (Cu), by means of through hole plating. After forming the through hole 15 in the resin film 10, through hole plating is carried out with copper so as to form copper plating (copper foil) on the wall surface of the through hole 15. The thickness of the copper foil is, for example, about 5 μm. Then the copper foils provided on the upper surface 10a and the lower surface 10b of the resin film 10 are patterned so as to form the metal layer 20 shown in FIG. 7(b). Etching of the copper foil may be employed for the patterning process. The metal layer 20 functions as the gate electrode 20.

Then the insulating layer 30 is formed so as to cover the metal layer 20 as shown in FIG. 7(c). The insulating layer 30 can be formed, for example, by applying an insulating material. The insulating layer 30 functions as the gate insulating film.

Application of the insulating material for forming the insulating layer 30 can be carried out by, for example, electrodeposition, spraying by means of a spray coater, or ink jet printing. While the insulating layer 30 is formed after patterning the metal layer 20 in the embodiment shown in FIG. 7, such a process may also be employed as the insulating layer 30 is formed in the pattern before patterning the metal layer 20, then the metal layer 20 is patterned by using the insulating layer 30 as an etching resist. In this case, to form the insulating layer 30, it is easier to form the insulating layer over the entire surface by dipping, then patterning the layer.

The through hole 15 is filled with a material that includes the organic semiconductor as shown in FIG. 8(a), so as to form the organic semiconductor section 50 in the through hole 15. The organic semiconductor section 50 can be formed by, for example, printing.

Then the drain electrode 40d is formed on the top end of the organic semiconductor section 50 and the source electrode 40s is formed at the bottom end, so as to obtain the semiconductor device 100 as shown in FIG. 8(b). The source electrode 40s or the drain electrode 40d may also be formed by forming metal layers on the resin film (upper surface 10a and lower surface 10b) that has the through hole 15 filled with the organic semiconductor section 50, then patterning the metal layers thereby forming the source electrode 40s or the drain electrode 40d. The source electrode 40s or the drain electrode 40d may also be formed by stacking or the like, besides patterning of the metal layer.

Thus the semiconductor device 100 has the gate electrode 20, the gate insulating layer 30 and the organic semiconductor section 50 formed in the through hole 15, namely in the space surrounded by the wall surface of the through hole 15, and therefore these members can be easily and accurately positioned.

As a result, the semiconductor device 100 is free from the problems described below encountered in the semiconductor device 1000 of the conventional art where the layers are formed by ink jet printing.

When the layers are formed by ink jet printing, it is necessary to hold the liquid material precisely at the predetermined positions by means of a bank or other members, resulting in problems related to the formation of the bank or other members and the positioning accuracy. In addition, there is such a problem that the organic device becomes thicker as flatness of the organic semiconductor device is maintained, since the layers such as the source electrode, the drain electrode, the organic semiconductor layer, the insulating layer and the gate electrode layer are stacked one on another on the substrate by an ink jet printing process. Moreover, there is a problem of decreasing yield of production due to the accuracy of positioning operations, when forming the layers one on another by printing. The yield of production tends to decrease as the semiconductor device 1000 becomes larger in size.

When the semiconductor device 1000 is used in an image display device such as an organic EL display, in particular, though the problem related to the printing process described above may be tolerated if the screen is small as in such a case as a cellular phone, the problem becomes conspicuous if the screen is large (a large screen of 1 meter class).

However, since the through hole 15 can be formed in the semiconductor device easily at the desired position by means of a laser or the like, the problem described above does not arise as the semiconductor element such as a TFT can be accurately positioned with ease.

Second Embodiment

FIG. 9 is a sectional view showing a method for manufacturing a semiconductor device 200 according to the second embodiment of the present invention. The semiconductor device 200 shown in FIG. 9(e) is a semiconductor device having a plurality of organic semiconductor sections 50 (or transistor structures TFT)).

The method for manufacturing the semiconductor device 200 will be described with reference to FIG. 9(a) to FIG. 9(e).

First, the resin film 10 is prepared as shown in FIG. 9(a). The resin film 10 is the same as that described in the first embodiment.

Then after forming a plurality of through holes 15 in the resin film 10 as shown in FIG. 9(b), the metal layer 20 is formed. The metal layer 20 can be formed by applying through hole plating to the resin film 10, then patterning the metal foil formed by the plating. A wiring pattern 25 can also be formed on the resin film 10, in addition to the metal layer 20 that has the portion covering the wall surface of the through hole 15, by patterning the metal foil.

The method described above for obtaining the wiring pattern 25 makes it possible to obtain the wiring pattern at a lower cost since it is a metal film formed by plating or the like and does not use expensive metal nano-paste as the conventional art does when forming the wiring by the printing process. Also because the wiring pattern 25 is formed from copper, there is such an advantage that the wiring pattern having significantly lower electrical resistance can be formed more easily than that of the conventional wiring pattern that is formed from metal nano-paste.

Then the insulating layer 30 is formed on the metal layer 20 as shown in FIG. 9(c). The insulating layer 30 can be formed, for example, by painting.

Then the through hole 15 having the metal layer 20 and the insulating layer 30 formed one on another on the inner wall thereof is filled with a material that includes the organic semiconductor as shown in FIG. 9(d), so as to form the organic semiconductor section 50. In case the organic semiconductor material is a polymeric organic semiconductor (such as polythiophene or derivatives thereof), it is preferable to form the organic semiconductor section 50 by the printing process. In case the organic semiconductor material is a low molecular organic semiconductor (such as pentacene), it is preferable to form the organic semiconductor section 50 by the vapor deposition process.

Then the source electrode 40s and the drain electrode 40d are formed so as to make contact with the organic semiconductor section 50 as shown in FIG. 9(e), to thereby obtain the semiconductor device 200 of this embodiment. As will be understood from FIG. 9(b), the pattern of the metal layer 20 can be determined as required in accordance to the organic semiconductor section 50.

The plurality of organic semiconductor sections 50 can be efficiently formed as described above by employing the manufacturing method shown in FIG. 9.

As shown in FIG. 9(e), a part of the plurality of through holes 15 (the through hole 15 located at the right in FIG. 9(e)) of the semiconductor device 200 may be used as a connecting through hole (via) for electrically connecting the wiring on one surface of the resin film 10 with the other surface, by disposing the metal layer 20 as an electrically conductive composition in the via, without forming a transistor (namely without forming the insulating layer 30, the organic semiconductor section 50, the source electrode 40s and the drain electrode 40d).

The semiconductor device 200 of the second embodiment may also be manufactured from the resin film 10 having copper foil stacked thereon, as shown in FIG. 10(a) to FIG. 10(f).

Figure 10:
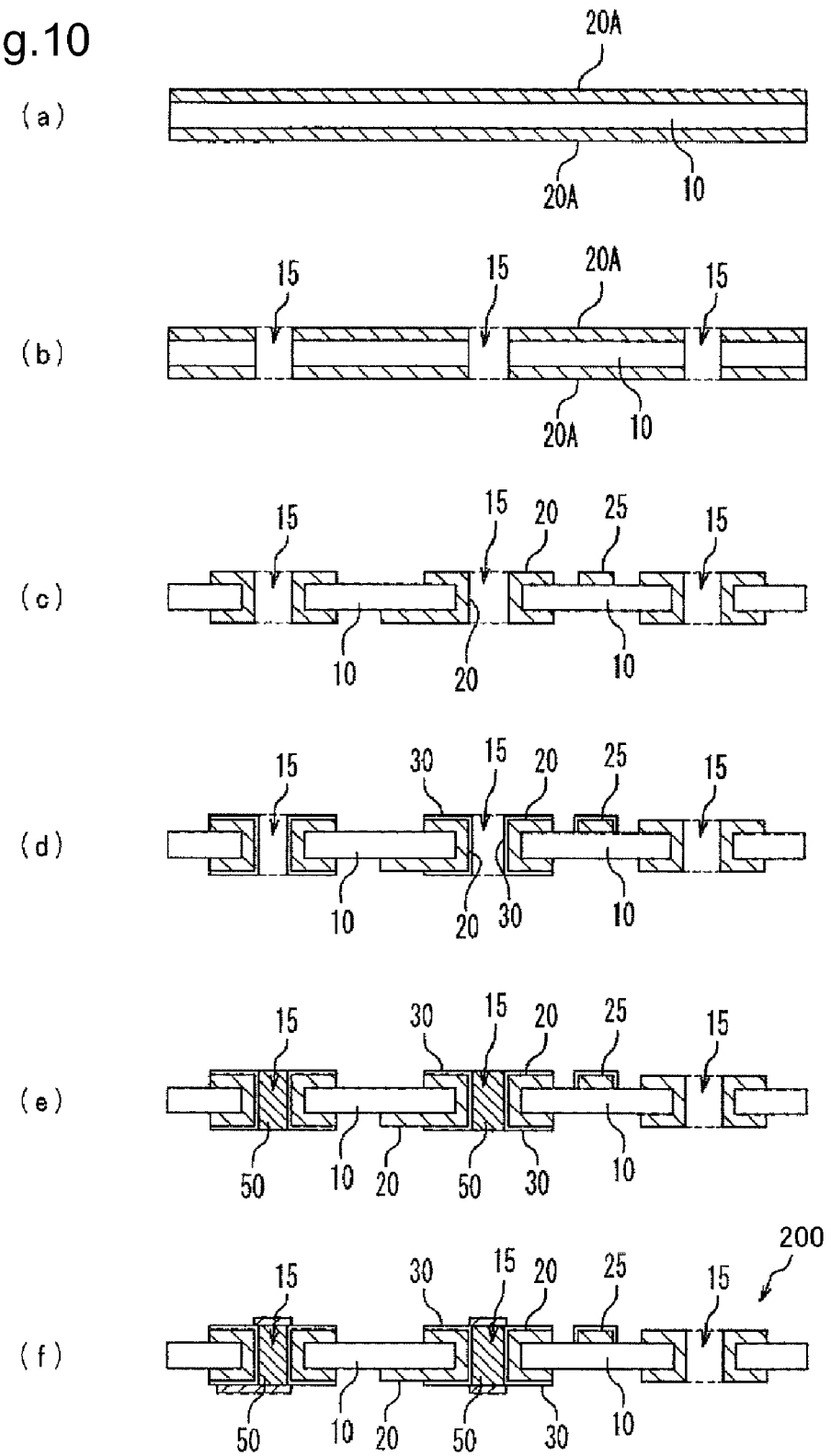
FIG. 10 is a sectional view showing another method for manufacturing the semiconductor device 200 according to the second embodiment of the present invention.

First, the resin film 10 having a metal foil (copper foil in this case) 20A formed thereon is prepared as shown in FIG. 10(a). Then the through holes 15 are formed in the resin film 10 that has the metal foil 20A formed thereon as shown in FIG. 10(b).

Then after forming a metal foil (copper foil in this case), that connects to the copper foil 20A, on the inner wall of the through hole 15 as shown in FIG. 10(c), the metal foil 20A is patterned to form the metal layer 20. In this embodiment, together with the metal layer 20 that has a portion covering the inner wall of the through hole 15, the wiring pattern 25 is also formed by this patterning process.

Then the insulating layer 30 is formed so as to cover the metal layer 20 as shown in FIG. 10(d). This is followed by the formation of the organic semiconductor section 50 in the through hole 15 as shown in FIG. 10(e). Similarly to the other embodiment described above, the organic semiconductor section 50 may be formed by a method selected from among various methods as required, such as application, printing, injection or vapor deposition.

Third Embodiment

Figure 11:
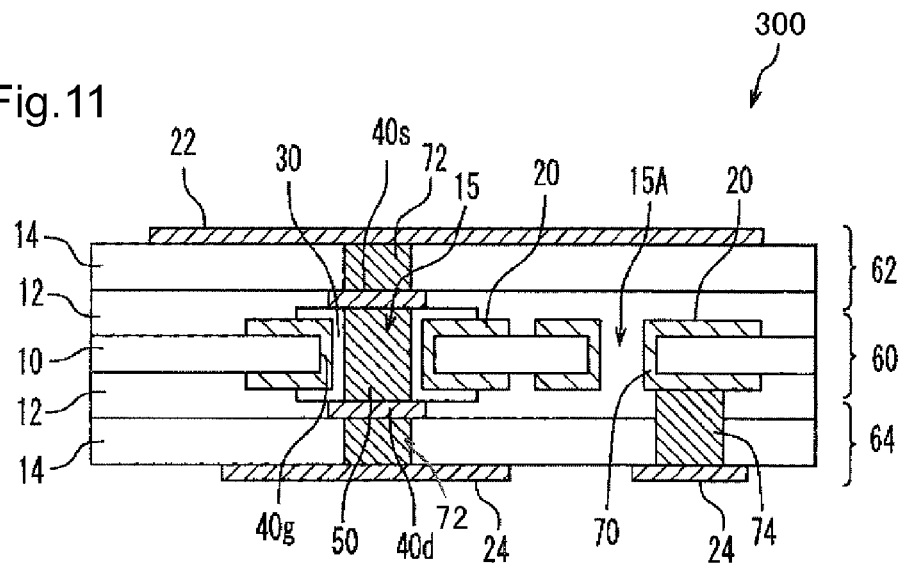
FIG. 11 is a sectional view schematically showing the constitution of a semiconductor device 300 according to a third embodiment of the present invention.

FIG. 11 is a sectional view showing a semiconductor device 300 according to the third embodiment of the present invention. The semiconductor device 300 has a substrate of stacked structure. The semiconductor device 300 has a substrate structure 60 that includes the resin film 10 having the organic semiconductor section 50 formed in the through hole 15, an upper substrate structure 62 and a lower substrate structure 64 that sandwich the substrate structure 60. The semiconductor device 300 having such a constitution can be easily manufactured by a stacking process.

The substrate structure 60 includes the constitution of the semiconductor device 100 described in the first embodiment from which the source electrode 40s and the drain electrode 40d are removed, and is similar to the substrate structure shown in FIG. 8(a), FIG. 9(d) and FIG. 10(e). In the substrate structure 60 shown in FIG. 11, a through hole 15A is also formed in addition to the through hole 15 filled with the organic semiconductor section 50. The through hole 15A has the metal layer 20 disposed on the wall surface thereof. The through hole 15A and the electrically conductive composition of the metal layer 20 constitute a via 70 for inter-layer connection.

The upper substrate structure 62 of the semiconductor device 300 has, on the lower surface thereof, an adhesive layer (or a resin film layer) 12 that is included in the upper substrate structure 62. The lower substrate structure 64 also has, on the upper surface thereof, an adhesive layer (or a resin film layer) 12 that is included in the lower substrate structure 64. The adhesive layer 12 of one of the upper substrate structure 62 and the lower substrate structure 64 (the upper substrate structure 62 in FIG. 11) is formed with the source electrode 40s embedded (or buried) therein, and the adhesive layer 12 of the other (the lower substrate structure 64 in FIG. 11) is formed with the drain electrode 40d embedded (or buried) therein. The source electrode 40s and the drain electrode 40d are put into ohmic contact with the organic semiconductor section 50, by bonding these adhesive layers 12 with the resin film 10.

As described above, since the semiconductor device 300 has a constitution in which the source electrode 40s and the drain electrode 40d are put into contact with the organic semiconductor section 50 by means of the adhesive layers 12, the process of patterning the source electrode 40s and the drain electrode 40d on the substrate structure 60 can be omitted. That is, the source electrode 40s and the drain electrode 40d that make contact with the organic semiconductor section 50 can be formed by simply stacking the upper substrate structure 62 and the lower substrate structure 64 that have the source electrode 40s or the drain electrode 40d, which has been patterned in advance, on the substrate structure 60.

Use of the stacking process also makes it easier to apply plating with a noble metal to the contact surface between the source electrode 40s or the drain electrode 40d and the organic semiconductor section 50.

The upper substrate structure 62 includes, in addition to the adhesive layer 12 and the source electrode 40s, a resin film 14 disposed on the adhesive layer 12, a via hole (through hole) provided in the resin film 14, a via 72 formed from the electrically conductive composition that fills the via hole and a wiring 22 disposed on the surface of the resin film opposite to the adhesive layer 12.

The source electrode 40s is connected to the wiring 22 through the via 72 formed in the resin film 14 of the upper substrate structure 62.

The lower substrate structure 64 includes, in addition to the adhesive layer 12 and the drain electrode 40d described above, the resin film 14 disposed on the adhesive layer 12 (on the lower side of the resin layer 12 in FIG. 13), a via hole (through hole) provided in the resin film 14, the via 72 formed from the electrically conductive composition that fills the via hole and a wiring 24 disposed on the surface of the resin film 12 opposite to the adhesive layer 12.

The drain electrode 40d is connected to the wiring 24 through the via 72 formed in the resin film 14 of the lower substrate structure 64. The via 74 is electrically connected to a via 70 (plated through hole) formed in the through hole 15A for inter-layer connection of the substrate structure 60.

The semiconductor device 300 utilizes the inter-layer connection structure wherein the upper substrate structure 62 and the lower substrate structure 64 sandwich the substrate structure 60 in which the through hole 15 is formed in the resin film 10, the metal layer 20 and the insulating layer 30 are formed one on another on the wall surface of the through hole 15, and the organic semiconductor section 50 is formed on the insulating layer 30. As a result, it is made possible to simplify the structure of the semiconductor device and improve the productivity of manufacturing the semiconductor device 300 (i.e. the semiconductor device can be manufactured under a high productivity condition).

Also because the organic semiconductor section 50 is formed in the through hole 15, it is made possible to omit the bank which is required when the conventional ink jet process is employed, so that positioning of the organic semiconductor section 50 can be easily controlled. Moreover, the organic semiconductor section 50 can be kept from making contact with oxygen or air by sealing the organic semiconductor section 50 by means of the source electrode 40s, the drain electrode 40d and the insulating layer 30, thus making it possible to suppress or moderate the decrease in the charge mobility due to the time degradation of the organic semiconductor section 50.

Figure 15:
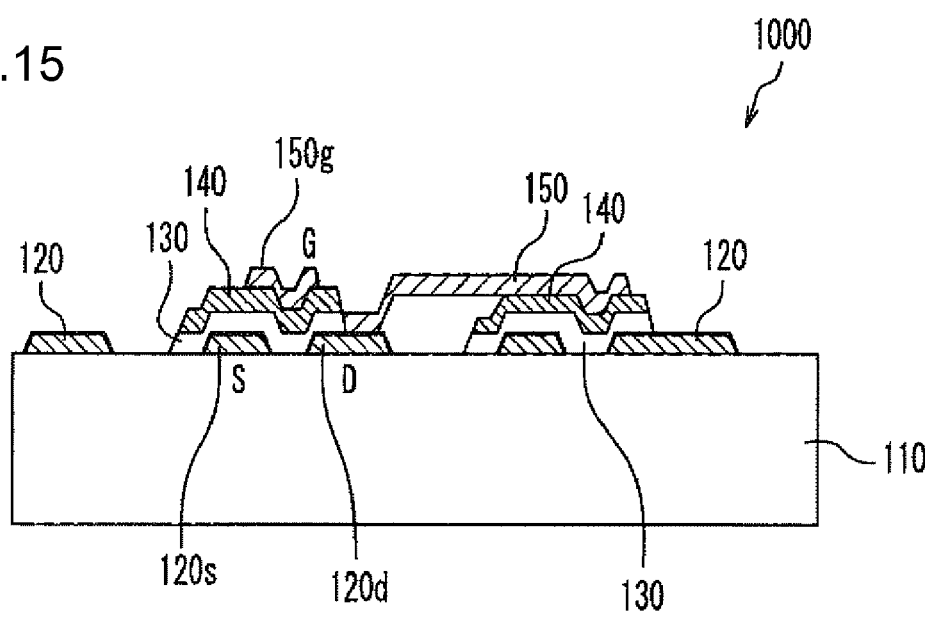
FIG. 15 is a sectional view schematically showing the constitution of a semiconductor device 1000 of the conventional art.

In addition, because the organic semiconductor section 50 is formed in the through hole 15, it is made possible to avoid the problem arising in the semiconductor device 1000 of the conventional art made by stacking as shown in FIG. 15. That is, the problem related to flatness of the organic semiconductor section 50 can be solved by forming it along the wall surface of the through hole 15, and the problem of positioning accuracy can also be solved by forming it in the through hole 15.

Moreover, since the organic semiconductor section 50 is formed in the through hole 15, stress is generated evenly for the bending of the substrate 10, and unevenness in the tensile stress and the compressive stress can be suppressed in comparison to the semiconductor device 1000 of the conventional art.

For the organic semiconductor material that constitutes the organic semiconductor section 50 of the third embodiment, while partially overlapping with that described above, the following materials may be used: (1) acene molecular materials selected from the group consisting of naphthalene, anthracene, tetracene, pentacene, hexacene and derivatives thereof; (2) pigments selected from the group consisting of a phthalocyanine-based compound, an azo-based compound and a perylene-based compound, and derivatives thereof; (3) low molecular compounds selected from the group consisting of a hydrazone compound, a triphenylmethane compound, a diphenylmethane compound, a stilbene compound, an allyl vinyl compound, a pyrazoline compound, a triphenylamine compound and a triallylamine compound, and derivatives thereof; and (4) polymeric compounds selected from the group consisting of poly-N-vinylcarbazole, poly-N-vinylcarbazole halide, polyvinylpyrene, polyvinyl anthracene, pyreneformaldehyde resin and an ethylcarbazole formaldehyde resin. Alternatively, the organic semiconductor material may also be a fluorenone-based compound, a diphenoquinone-based compound, a benzoquinone-based compound, an indenone-based compound, a porphyrin-based compound, a polythiophene-based compound or a polyphenylene-based compound.

The gate electrode 20, the source electrode 40s and the drain electrode 40d of this embodiment may be formed from a material selected from the group consisting of chromium (Cr), titanium (Ti), copper (Cu), aluminum (Al), molybdenum (Mo), tungsten (W) nickel (Ni), gold (Au), palladium (Pd), platinum (Pt), silver (Ag), tin (Sn), electricity conducting polyanyline, electricity conducting polypirrol, electricity conducting polythiazyl and electricity conducting polymer, and combinations thereof. The source electrode 40s and the drain electrode 40d may also be constituted from double-layer electrode of Au layer and Cu layer, or double-layer electrode of Au layer and Pt layer.

Fourth Embodiment

Figure 12:
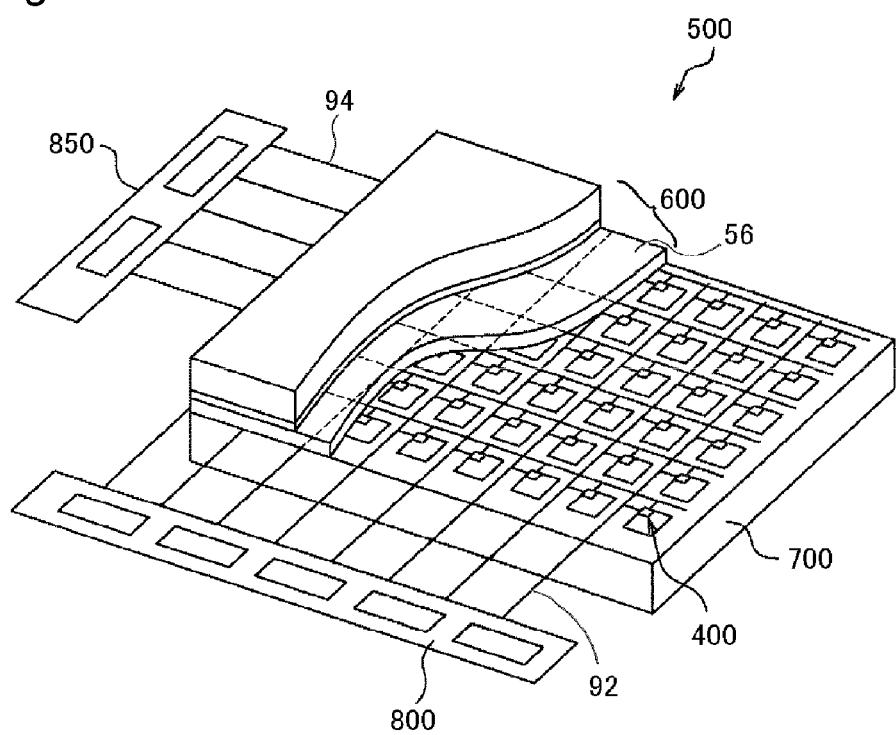
FIG. 12 is a perspective view schematically showing an image display device 500 according to a fourth embodiment of the present invention.

FIG. 12 is a cutaway perspective view showing an image display device (organic EL display device) 500 according to the present application. The display device (apparatus) 500 comprises a light emitting layer 600 consisting of a plurality of light emitting elements 56 disposed in an orderly arrangement, a drive circuit layer 700 consisting of a plurality of semiconductor devices 400 for driving (switching ON/OFF) the light emitting elements and driver sections 800, 850 that supply electric current through a data line 92 and a switching line 94 to the drive circuit layer 700.

Figure 13:
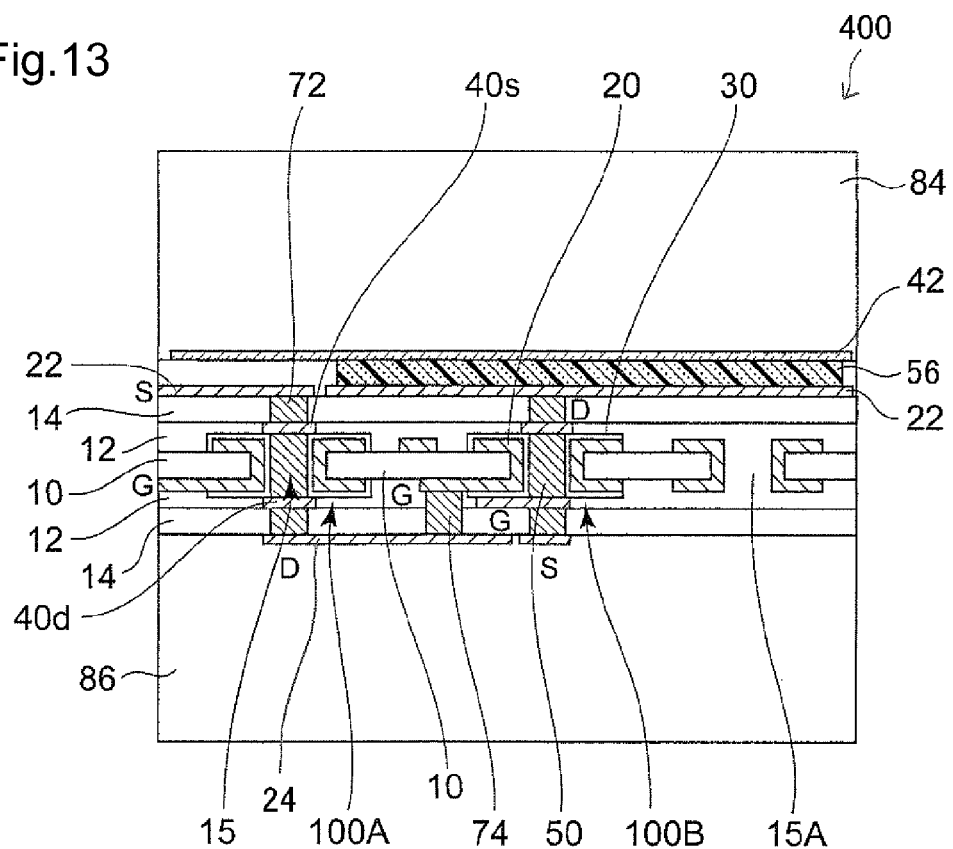
FIG. 13 is a sectional view schematically showing the constitution of a semiconductor device 400 according to the fourth embodiment of the present invention.

FIG. 13 is a sectional view showing the semiconductor device 400.

The semiconductor device 400 is a light emitting element control device that has one organic EL element (light emitting element) 56 for each pixel of the display device 500, and controls the emission of light from the light emitting element 56. The semiconductor device 400 will be described below with reference to FIG. 13.

Figure 14:
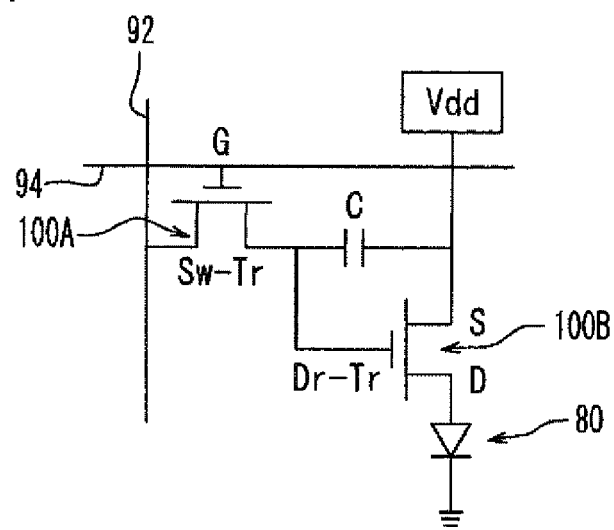
FIG. 14 is a diagram showing an equivalent circuit of the semiconductor device 400.

The semiconductor device 400 has two semiconductor elements (semiconductor elements 100A, 100B) included in the semiconductor device (organic semiconductor device) 100 of the first embodiment, as represented by the equivalent circuit of FIG. 14.

Of the two semiconductor elements 100A and 100B, one is used as a switching transistor 100A and the other is used as a driver transistor 100B. The semiconductor elements 100A and 100B are disposed on a reinforcing film 86 (for example, a resin film such as PET, PEN).

The semiconductor elements 100A, 100B of this embodiment are formed under the organic EL element 56, and the semiconductor element 100B is connected with the organic EL element 56. Formed above the organic EL element 56 is a transparent electrode 42 that is electrically connected to the organic EL element 56, and is provided with a protective film (for example, a resin film such as PET, PEN) 84 formed thereon.

The wiring 92 shown in FIG. 14 is the data line, and is electrically connected to the wiring 22 that is connected to the source electrode 40s of the semiconductor element 100A of FIG. 13, although not shown in FIG. 13. The semiconductor wiring 94 is a selection line (switching line), and is electrically connected to the gate electrode of the semiconductor element 100A.

The light emitting element 56 is driven to emit light by controlling the currents flowing in the data line 92 and in the switching line 94 by means of the driver sections 800, 850, thereby controlling the currents flowing from the driver transistor 100B to the organic EL element 56 and the transparent electrode 42 by means of the semiconductor element 100A. In other words, the semiconductor element 100A is used as a switching transistor that turns on/off the organic EL element (light emitting element) 56.

Depending on the constitution of the display device 500, three or more semiconductor elements such as transistors, instead of two (one semiconductor element 100A and one semiconductor element 100B), may be provided and the semiconductor element of the semiconductor device 100 of this embodiment may also be provided as the third or further transistor.

Besides the semiconductor device 100, any of the semiconductor devices (semiconductor devices 101, 101', 102, 103, 200, 300) of the present invention described in this specification may be used as the semiconductor element (the switching transistor 100A and the driver transistor 100B) of the semiconductor device 400.

Instead of the semiconductor device 400, the semiconductor device 200 or 300 may also be used in the driver circuit layer 700.

Application of all of the semiconductor devices and the semiconductor elements of the present invention is not limited to an organic EL display, and these devices and elements may be used in other display devices (such as liquid crystal display devices), and also in electronic paper. Moreover, all of the semiconductor devices and the semiconductor elements of the present invention can be used in various applications (such as RF-ID, memory, MPU, solar cell and sensor) that are being studied as the fields to apply the printing electronics.

The display device 500 may be used as other types of display devices such as a liquid crystal display or a plasma image display device, besides the organic EL display device, by replacing the organic EL elements described above with other types of light emitting elements such as a liquid crystal or a plasma light emitting element.

While the present invention has been described by way of preferred embodiments, the description is not restrictive and leaves the possibilities of various modifications. For example, the semiconductor device 100 is manufactured one by one in the embodiment described above, although the invention is not limited to this and a method of manufacturing a plurality of devices may also be employed. A roll-to-roll process may be employed as such a manufacturing method. The effects of the constitution of this embodiment can be exploited more conspicuously when an organic semiconductor material having higher charge mobility to be developed in the future is used, thus providing greater technological advantage.

The present invention makes it possible to provide a semiconductor device that has a simple structure that utilizes the inter-layer connection structure and high density of integration.

What is claimed is:

1. A semiconductor device comprising:
    a resin film having a through hole; and
    a semiconductor element comprising a gate electrode disposed on the inner wall of the through hole, an insulating layer covering the gate electrode within the through hole, an organic semiconductor disposed on the insulating layer within the through hole, and a source electrode and a drain electrode electrically connected to the organic semiconductor;
    wherein the gate electrode covers the wall surface of the through hole, and the organic semiconductor is hollow in the inside thereof.

2. The semiconductor device according to claim 1, wherein the source electrode makes contact with the entire surface of one end of the organic semiconductor.

3. The semiconductor device according to claim 1, wherein the drain electrode makes contact with the entire surface of the other end of the organic semiconductor.

4. The semiconductor device according to claim 1, wherein the organic semiconductor is sealed by the source electrode, the drain electrode and the insulating layer.

5. The semiconductor device according to claim 1, wherein the hollow space of the organic semiconductor is filled with an insulating material.

6. The semiconductor device according to claim 1, wherein at least one of the source electrode and the drain electrode makes contact with the organic semiconductor within the through hole.

7. The semiconductor device according to claim 1, wherein the resin film has a second via formed from a second through hole and an electrically conductive composition in the second through hole, and
    a wiring disposed on one surface of the resin film and a wiring disposed on the other surface of the resin film are electrically connected with each other by the second via.

8. The semiconductor device according to claim 1, further comprising:
    second resin film, one surface of the second resin film making contact with the surface of the resin film on the source electrode side thereof through a first adhesive layer; and
    a third via formed from a third through hole formed in the second resin film and an electrically conductive composition in the third through hole,
    wherein the source electrode is electrically connected with a wiring disposed on the other surface of the second resin film through the third via.

9. The semiconductor device according to claim 8, wherein the source electrode is embedded in the first adhesive layer.

10. The semiconductor device according to claim 1, further comprising:
    a third resin film, one surface of the third resin film making contact with the surface of the resin film on the drain electrode side thereof through a second adhesive layer; and
    a fourth via formed from a fourth through hole formed in the third resin film and an electrically conductive composition in the fourth through hole,
    wherein the drain electrode is electrically connected with a wiring disposed on the other surface of the third resin film through the fourth via.

11. The semiconductor device according to claim 10, wherein the drain electrode is embedded in the second adhesive layer.

12. The semiconductor device according to claim 1, wherein the organic semiconductor is formed from a polymeric organic semiconductor material.

13. The semiconductor device according to claim 1, wherein the organic semiconductor is formed from a low molecular organic semiconductor material.

14. The semiconductor device according to claim 1, wherein the resin film is formed from one material selected from among the group consisting of a polyimide resin, a polyamide resin, a polyethylene naphthalate resin and an aramid resin.

15. The semiconductor device according to claim 1, wherein the source electrode and the drain electrode are formed from noble metal.

16. An image display device comprising a display section having an array of light emitting elements and a drive circuit layer driving the light emitting elements used in the display section, wherein the drive circuit layer comprises the semiconductor device according to claim 1.

17. The image display device according to claim 16, wherein the semiconductor element is used as an ON/OFF switching transistor.

18. The image display device according to claim 16, wherein the semiconductor element is used as driver transistor driving light emission by the light emitting element.

19. The image display device according to claim 16, wherein the light emitting element is an organic electroluminescence element.

20. A method for manufacturing a semiconductor device, comprising:
    forming a through hole in a first resin film;
    disposing a gate electrode on the inner wall of the through hole, the gate electrode covering the wall surface of the through hole;
    forming an insulating layer covering the gate electrode within the through hole;
    forming an organic semiconductor disposed on the insulating layer within the through hole, the organic semiconductor being hollow in the inside thereof; and
    forming a source electrode and a drain electrode electrically connected to the organic semiconductor.

21. The method for manufacturing a semiconductor device according to claim 20, further comprising:
    embedding the source electrode in a second resin film, and
    electrically connecting the source electrode and the organic semiconductor by disposing the second resin film having the source electrode embedded therein on the first resin film.

22. The method for manufacturing a semiconductor device according to claim 20, further comprising:
    embedding the drain electrode in a third resin film, and
    electrically connecting the drain electrode and the organic semiconductor by disposing the third resin film having the drain electrode embedded therein on the first resin film.

* * * * *